(12) United States Patent
Chien et al.

(10) Patent No.: US 6,436,759 B1
(45) Date of Patent: Aug. 20, 2002

(54) METHOD FOR FABRICATING A MOS TRANSISTOR OF AN EMBEDDED MEMORY

(75) Inventors: Sun-Chieh Chien; Chien-Li Kuo, both of Hsin-Chu (TW)

(73) Assignee: Microelectronics Corp., Hsin Chu (TW)

( * ) Notice: Subject to any disclaimer, the term of this patent is extended or adjusted under 35 U.S.C. 154(b) by 6 days.

(21) Appl. No.: 09/764,330

(22) Filed: Jan. 19, 2001

(51) Int. Cl.$^7$ .................................. H01L 21/8247
(52) U.S. Cl. .................. 438/241; 438/258; 438/981; 438/275
(58) Field of Search ................. 438/241, 258, 438/981, 275

(56) References Cited

U.S. PATENT DOCUMENTS 6,110,782 A * 8/2000 Chu et al. ............... 438/275
6,235,586 B1 * 5/2001 Au et al. .................. 438/258
2001/0016407 A1 * 8/2001 Schoenfeld et al. ........ 438/618

* cited by examiner

*Primary Examiner*—Richard Booth
(74) *Attorney, Agent, or Firm*—Winston Hsu

(57) ABSTRACT

A memory array area and a periphery circuit region on the surface of a semiconductor wafer are defined, and a gate oxide layer and an undoped polysilicon layer are sequentially formed on the wafer. Next, the undoped polysilicon layer in the memory array area is implanted to form a doped polysilicon layer, followed by etching of the doped polysilicon layer in the memory array area down to a predetermined thickness. Next, a silicide layer and a protection layer are formed on the surface of the semiconductor wafer. A photo-etching-process (PEP) is used to etch portions of the protection layer, the silicide layer, the undoped polysilicon layer and the doped polysilicon layer to form a plurality of gates. Finally, a LDD and spacers of each MOS transistor, and a source and a drain of each MOS transistor in the periphery circuit region are formed.

14 Claims, 8 Drawing Sheets

METHOD FOR FABRICATING A MOS TRANSISTOR OF AN EMBEDDED MEMORY

BACKGROUND OF THE INVENTION

1. Field of the Invention

The present invention relates to a method of manufacturing a MOS transistor of an embedded memory, and more particularly, to a method of manufacturing a MOS transistor with different deposition thicknesses of the gate conductors in a memory array area and in a periphery circuit region of an embedded memory.

2. Description of the Prior Art

With increasing integration, the present trend of manufacturing semiconductor integrated circuits has been to integrate memory cell arrays and high-speed logic circuit elements onto a single chip. An embedded memory composed of memory arrays and logic circuits significantly reduces the circuit area and increases the signal processing speed.

Please refer to FIG. 1 to FIG. 9. FIG. 1 to FIG. 9 are cross-sectional diagrams of a prior art method for manufacturing a metal-oxide-semiconductor (MOS) transistor of an embedded memory on a semiconductor wafer 10. As shown in FIG. 1, the surface of a silicon substrate 16 is divided into a memory array area 12 and a periphery circuit region 14, with each region separated by several shallow trench isolation (STI) structures 11. The prior art method involves the formation of a dielectric layer 18, a polysilicon layer 20 and an etching barrier layer 22, respectively, on the surface of the semiconductor wafer 10. Then, as shown in FIG. 2, a mask layer 24 is formed over the etching barrier layer 22 in the periphery region 14, and an isotropic wet etching process is used to remove both the etching barrier layer 22 and the polysilicon layer 20 in the memory array area 12.

As shown in FIG. 3, the mask layer 24 above the etching barrier layer 22 is then removed, followed by the stripping away of the dielectric layer 18 in the memory array region 12 to expose the substrate surface 16. As shown in FIG. 4, a dielectric layer 26 is formed over the exposed substrate 16, and serves as a gate oxide layer in the memory array area 12. Thereafter, a polysilicon layer 28, a tungsten silicide layer 30 and a silicon nitride layer 32 are formed, respectively, over the surface of the semiconductor wafer 10.

In the next step, as shown in FIG. 5, a photoresist layer 34 is deposited over the silicon nitride layer 32 and a lithographic process is performed to define gate patterns in both the memory array area 12 and the periphery circuit region 14. Using the photoresist layer 34 as a mask, the silicon nitride layer 32, the tungsten silicide layer 30 and the polysilicon layer 28 are then etched to expose the dielectric layer 26 in the memory array area 12 as well as the etching barrier layer 22 in the periphery circuit region 14. As shown in FIG. 6, the photoresist layer 34 is then removed, followed by the deposition of another photoresist layer 36 in the memory array area 12 to protect the gate 33. The gate 33 includes the dielectric layer 26, the polysilicon layer 28, the tungsten silicide layer 30 and the silicon nitride layer 32.

As shown in FIG. 7, the photoresist layer 36 and the silicon nitride layer 32 of the periphery circuit region 14 are used as hard masks to remove both the etching barrier layer 22 and the polysilicon layer 20 in the periphery circuit region 14 not covered by the silicon nitride layer 32. Next, the photoresist layer 36 is used again as a hard mask to remove the silicon nitride layer 32, the tungsten silicide layer 30 and the polysilicon layer 28 in the periphery circuit region 14. Then, a gate 35 is formed in the periphery circuit region 14, followed by the removal of the photoresist layer 36.

As shown in FIG. 8, an ion implantation process is then performed to form lightly doped drains (LDD) 38 of a MOS transistor. Next, a silicon nitride layer 43 is deposited over the semiconductor wafer 10. An anisotropic etching process is used to remove the silicon nitride layer 43 in the periphery circuit region 14 as well as to form spacers 44 on the walls of the gate 35 structures, whereby the remaining etching barrier layer 22 is removed after the formation of the spacers 44. A source 40 and drain 42 of a MOS transistor is then formed in the periphery circuit region 14. Finally, as shown in FIG. 9, a self-aligned silicide operation is carried out to form salicide layers 46 above each source 40, drain 42 and gate 35 structure in the periphery circuit region 14.

To satisfy the requirements of process integration and production yield rate, a self-aligned contact (SAC) process is now widely used during the formation of the contact plug in the memory array area 12 to increase misalignment tolerances. However, a salicide process is also needed to form the salicide layer 46 on the surfaces of the source 40, the drain 42 and the gate 35 in the periphery circuit region 14 to reduce the contact interface resistance and improve the electrical performance of the logic circuits. As a result, problems such as a large difference in gate height between the memory array area 12 and the periphery circuit region 14 are produced.

In addition, a thicker polysilicon layer 20 is deposited on the semiconductor wafer 10 to avoid boron penetration from the boron doped in the NMOS gate. When simultaneously forming the polysilicon layer 20 in both the memory array area 12 and in the periphery circuit region 14, a much thicker polysilicon layer is produced than one made by an ordinary memory process. Consequently, over-hanging and void bridges are easily formed between the two adjacent gates in the memory array area 12 during the deposition of an inter-layer dielectric (ILD) layer. As a result, short circuiting may occur when an electrical connection of the contact plug is formed between the two adjacent gates with the conductors filling in the voids.

In addition, the prior method of fabricating an embedded memory suffers from a serious topographical problem of the inter-layer dielectric (ILD) layer. More specifically, the prior art method encounters a problem resulting from a large difference in the height of the ILD layer between the memory array area 12 and the periphery circuit region 14 of an embedded memory.

SUMMARY OF THE INVENTION

It is a primary objective of the present invention to provide a method of manufacturing a MOS transistor with different deposition thicknesses of the gate conductors in a memory array area and in a periphery circuit region of an embedded memory.

It is another objective of the present invention to provide a method of manufacturing a MOS transistor of an embedded memory to reduce the step height difference of gates between the periphery circuit region and the memory array area so as to improve planarization of an inter-layer dielectric (ILD) layer.

It is still another objective of the present invention to provide a method of manufacturing a MOS transistor of an embedded memory to prevent the formation of void bridges between two gates when filling the ILD layer in the memory array area.

The method of the present invention involves first defining a memory array area and a periphery circuit region on the surface of a semiconductor wafer and to sequentially deposit a gate oxide layer, a polysilicon layer and a dielectric layer.

Next, the polysilicon layer in the memory array area is implanted to form a doped polysilicon layer. Thereafter, the doped polysilicon layer in the memory array area is etched to a predetermined thickness and the dielectric layer in the memory array area is removed. A silicide layer and a protection layer are formed on the surface of the semiconductor wafer.

A photo-etching-process (PEP) is used to etch portions of the protection, silicide, undoped and doped polysilicon layers to form a plurality of gates. Finally, a lightly doped drain and a spacer of each MOS transistor, and a source and drain of each MOS transistor in the periphery circuit region are formed.

According to the present invention, the step height difference between the periphery circuit region and the memory array area is reduced since the doped polysilicon layer in the memory array area is etched to only half the normal thickness. As a result, short-circuiting due to the formation of void bridges and boron penetration are both prevented.

These and other objectives of the present invention will no doubt become obvious to those of ordinary skill in the art after reading the following detailed description of the preferred embodiment, which is illustrated in the various figures and drawings.

DETAILED DESCRIPTION OF THE PREFERRED EMBODIMENT

Figure 1:
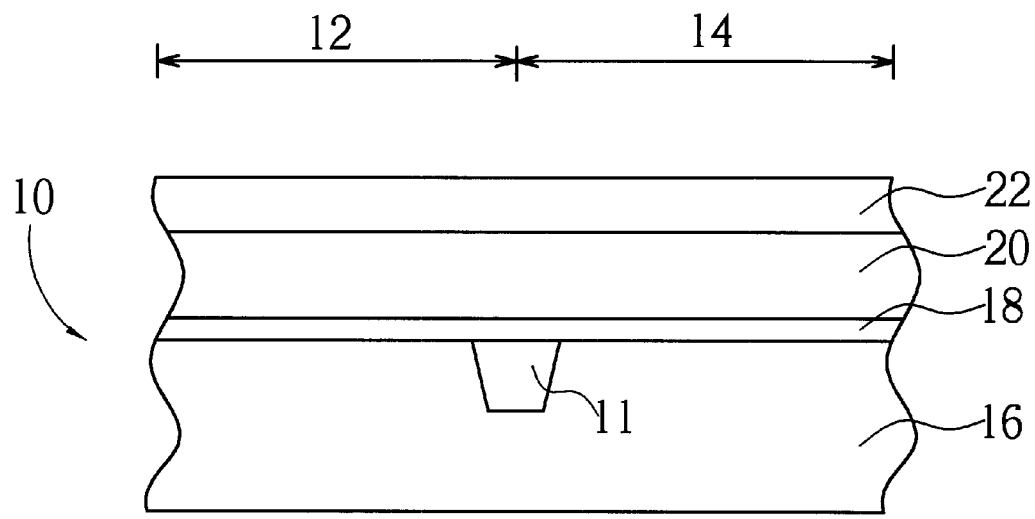
FIG. 1 to FIG. 9 are cross-sectional diagrams of manufacturing a MOS transistor of an embedded memory according to the prior art.
Figure 2:
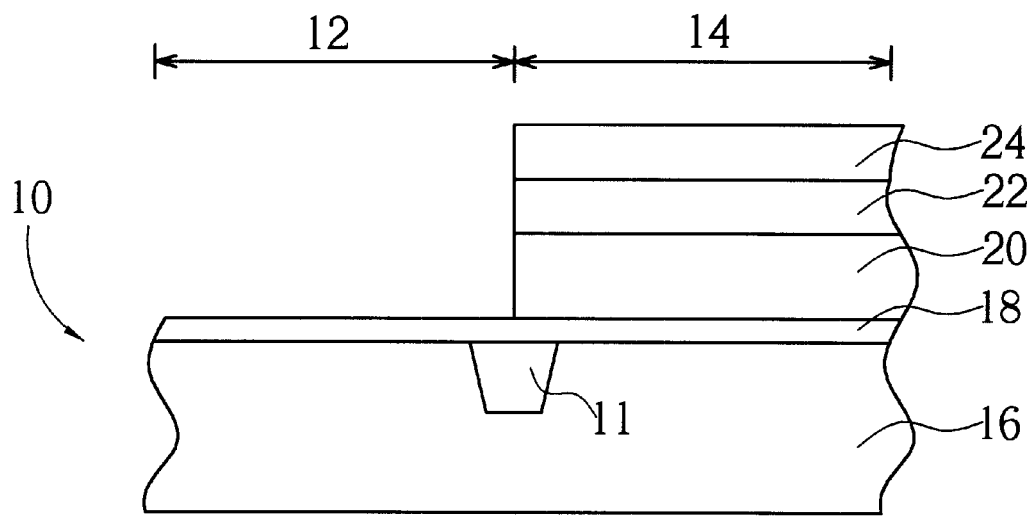
Figure 3:
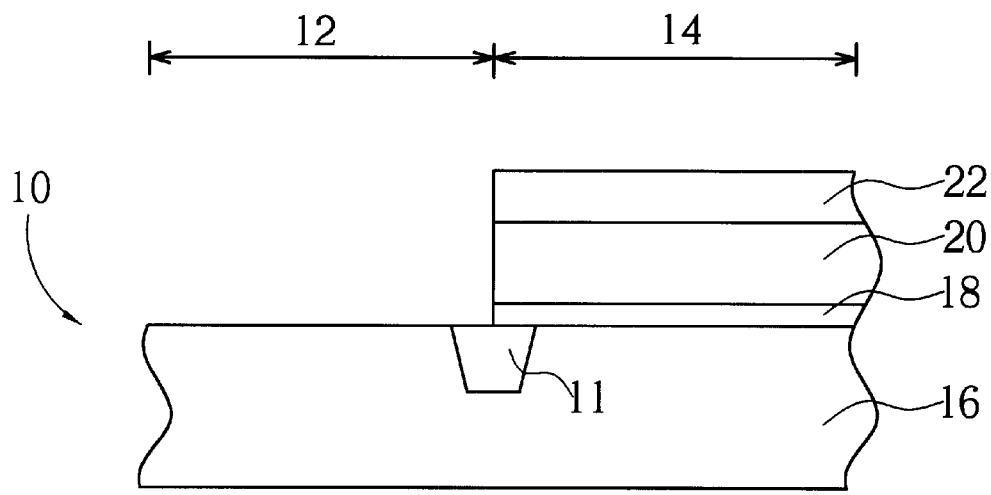
Figure 4:
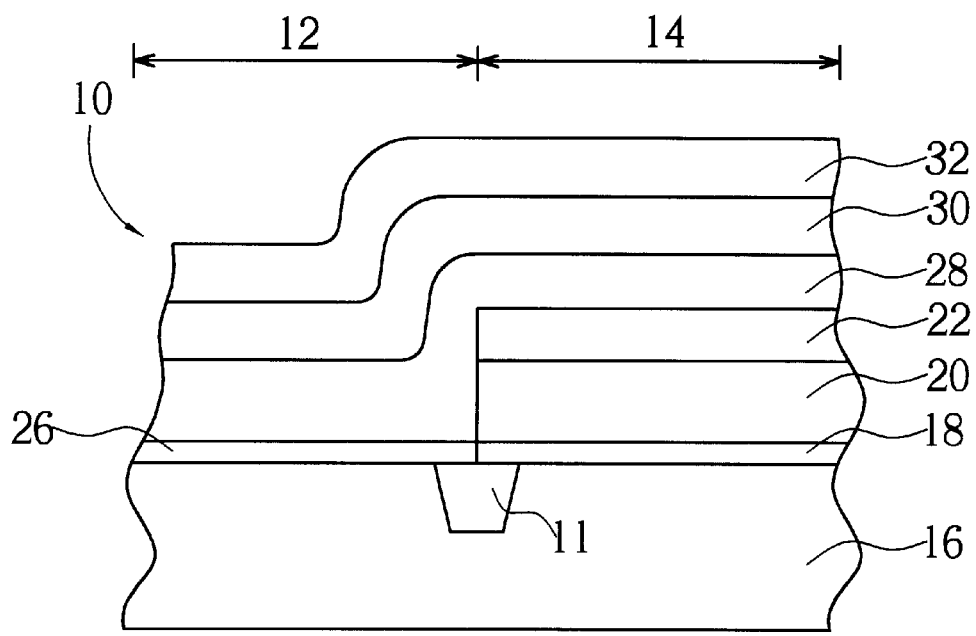
Figure 5:
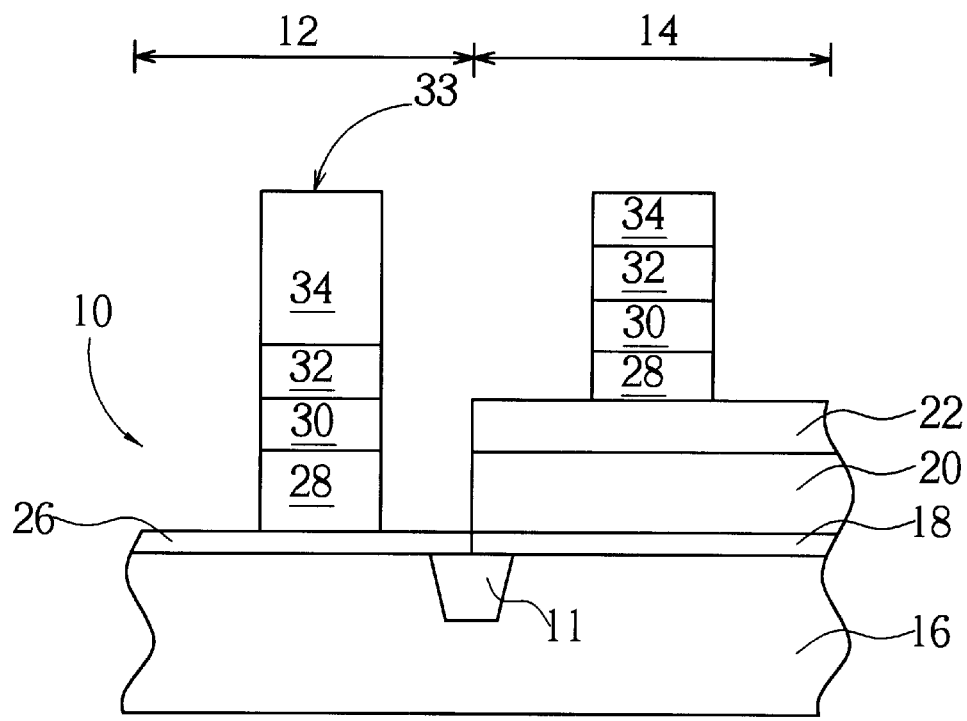
Figure 6:
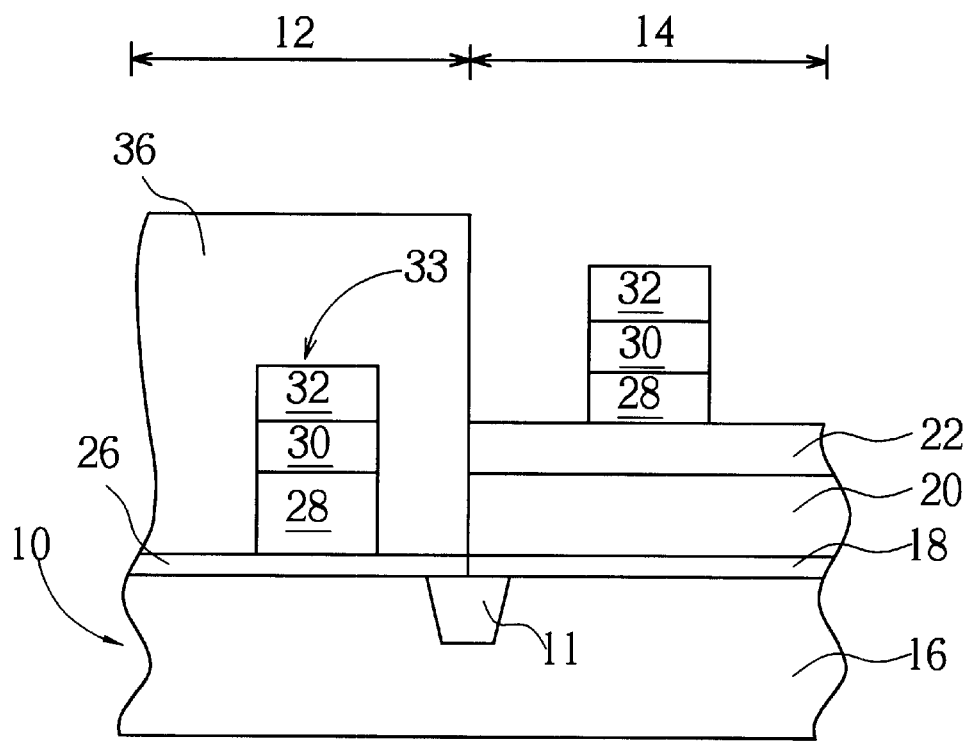
Figure 7:
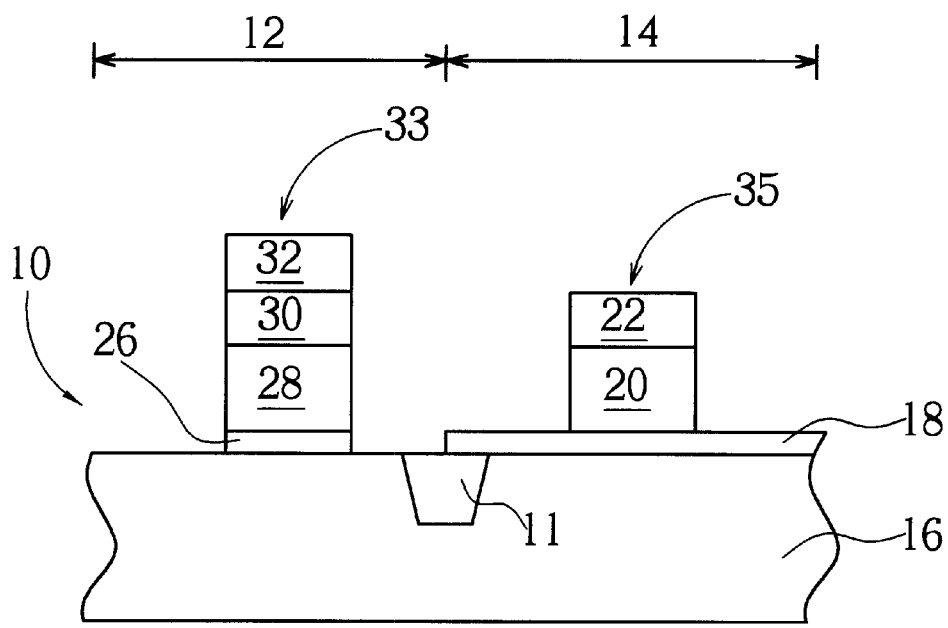
Figure 8:
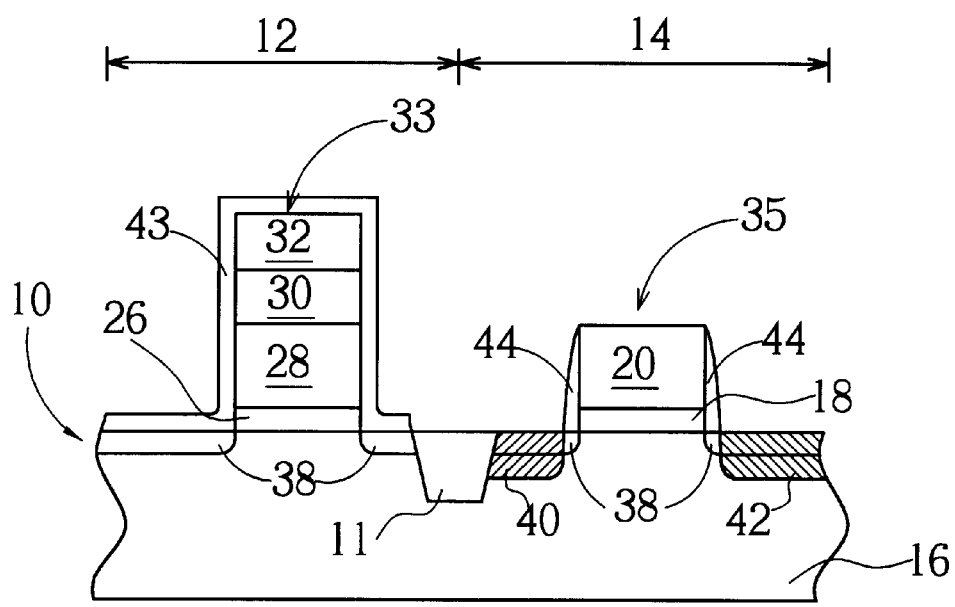
Figure 9:
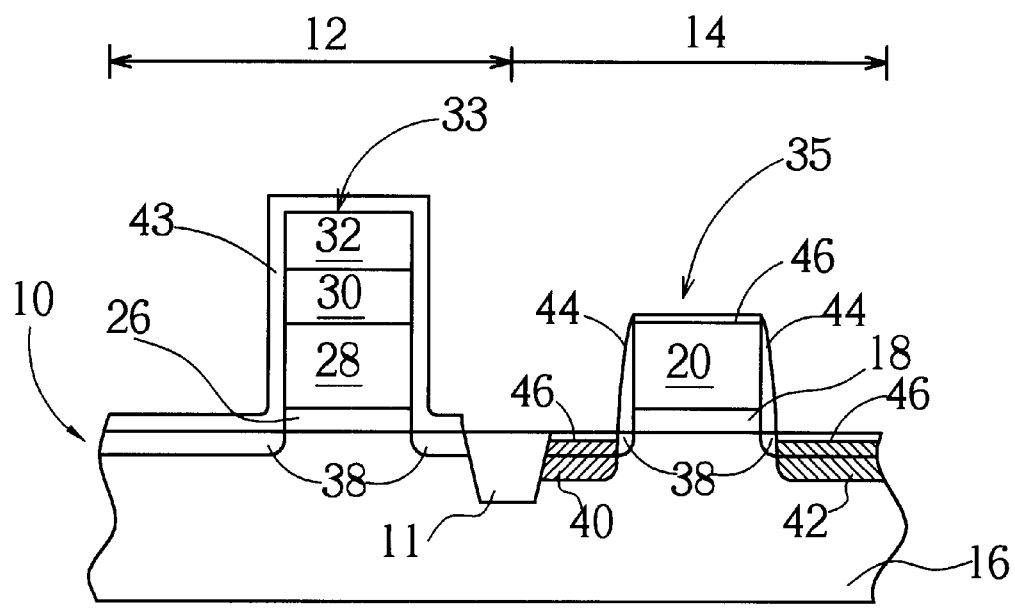

Please refer to FIG. 10 to FIG. 15. FIG. 10 to FIG. 15 are cross-sectional diagrams of manufacturing a MOS transistor of an embedded memory on semiconductor wafer 60 according to the present invention. A semiconductor wafer 60 has both a memory array area 62 and a periphery circuit region 64 defined on the surface of a silicon substrate 61. The memory array area 62 comprises at least one cell-well 66, and the periphery circuit region 64 comprises at least one N-well 68 and at least one P-well 70. Several shallow trench isolation (STI) structures 71 are formed to separate each region.

Figure 10:
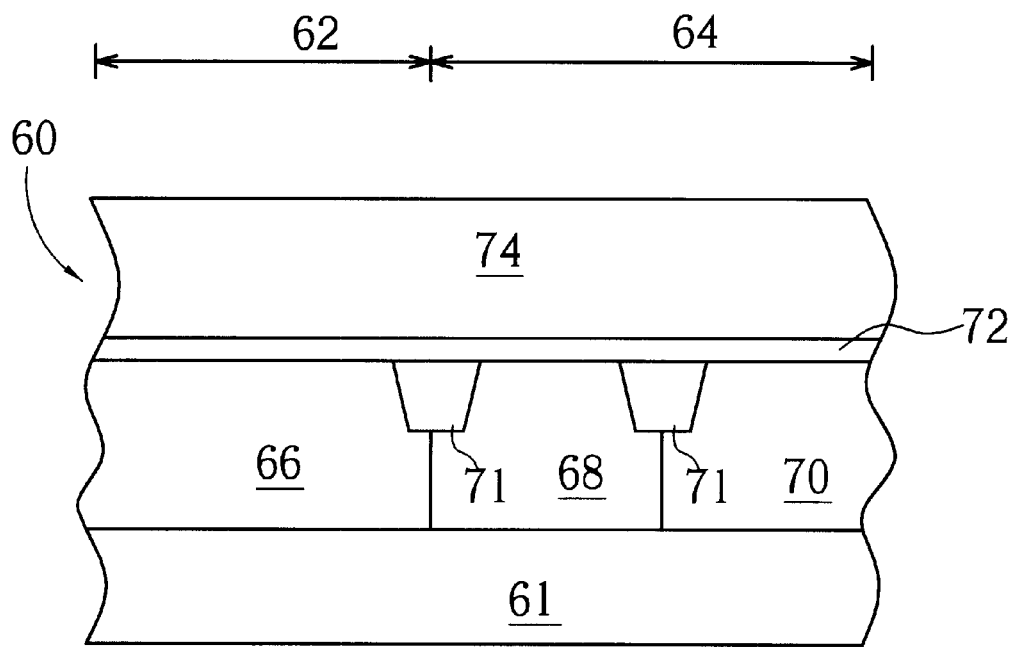
FIG. 10 to FIG. 15 are cross-sectional diagrams of manufacturing a MOS transistor of an embedded memory according to the present invention.
Figure 11:
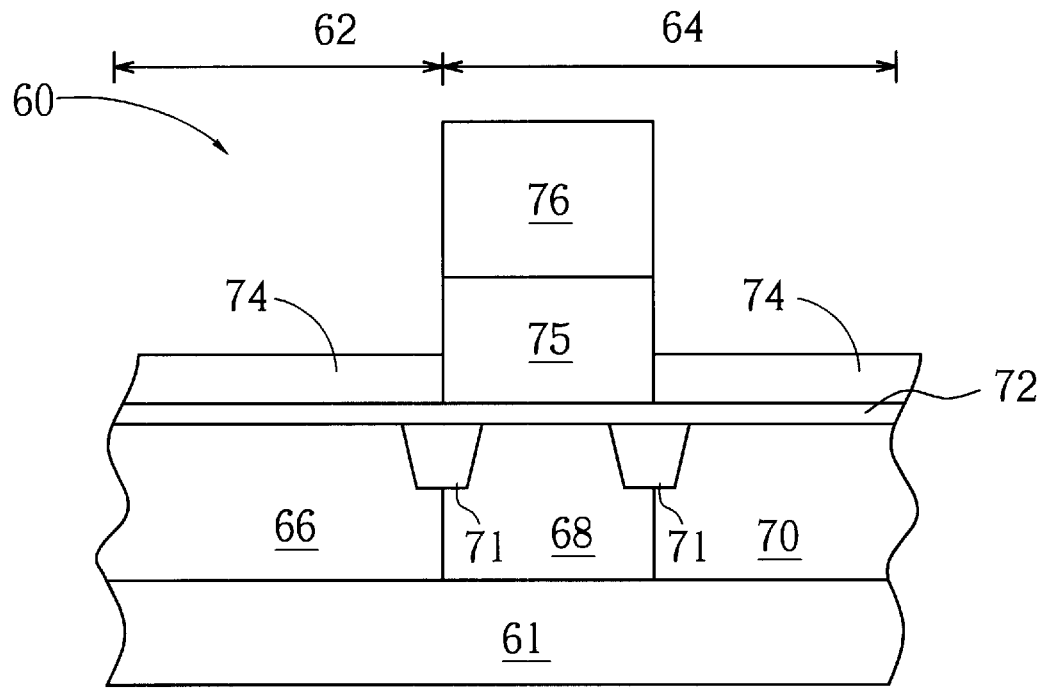
Figure 12:
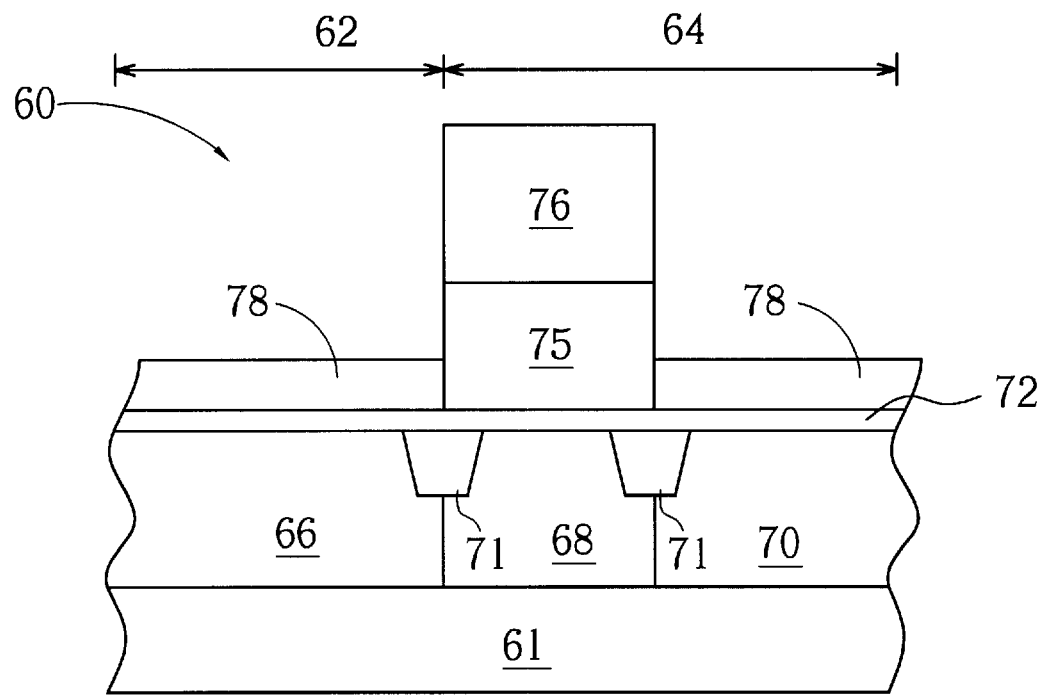

As shown in FIG. 10, the present invention involves first forming a dielectric layer 72 and an undoped polysilicon layer 74 on the surface of the semiconductor wafer 60, respectively. Next, as shown in FIG. 11, a photolithographic and a P-type ion implantation process are performed to transform the undoped polysilicon layer 74 positioned above the N-well 68 into a $P^+$ doped polysilicon layer 75. Next, a photoresist layer (not shown) is formed on the surface of the semiconductor wafer 60 followed by a photolithographic, exposure and development process so that a mask layer 76 is formed above the N-well 68 in the periphery circuit region 64. An etching process is performed to remove the undoped polysilicon layer 74 uncovered by the mask layer 76 down to approximately half of the total thickness of the undoped polysilicon layer 74, which is about 1000~1900 angstroms (Å). As shown in FIG. 12, a N-type ion implantation process is performed on the undoped polysilicon layer 74 uncovered by the mask layer 76, to transform the undoped polysilicon layer 74 positioned in both the memory array area 62 and on the P-well 70 in the periphery circuit region 64 into a $N^+$ doped polysilicon layer 78.

Alternatively, the N-type ion implantation process can be performed on the undoped polysilicon layer 74, uncovered by the mask layer 76, prior to its etching to transform the undoped polysilicon layer 74 positioned on both the memory array area 62 and the P-well 70 in the periphery circuit region 64 into the $N^+$ doped polysilicon layer 78. Thereafter, an etching process is performed to remove the $N^+$ doped polysilicon layer 78 uncovered by the mask layer 76 down to approximately half the total thickness of the undoped polysilicon layer 74.

Figure 13:
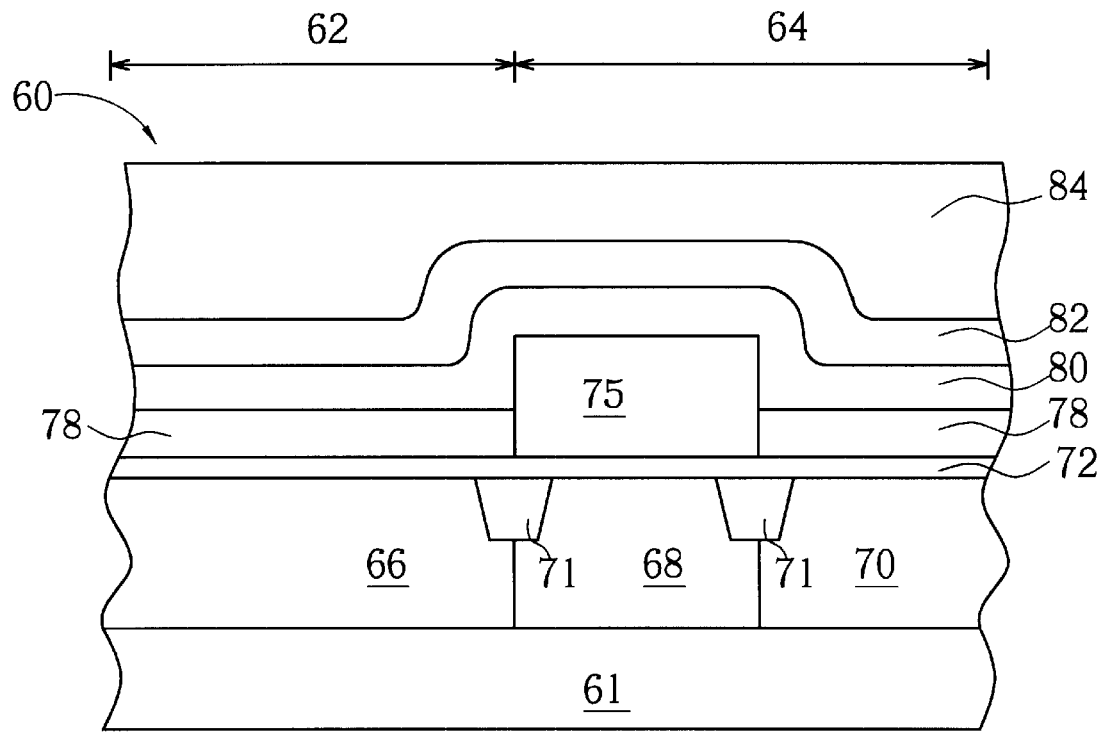

Subsequently, as shown in FIG. 13, after removing the mask layer 76 in the periphery circuit region 64, a silicide layer 80 to reduce the contact interface resistance of the doped polysilicon layers 75 and 78, a silicon-oxy-nitride ($SiO_xN_y$) layer (not shown), a silicon nitride layer 82 functioning as a protection layer, and a photoresist layer 84 are formed, respectively, on the surface of the semiconductor wafer 60. Therein, the silicon-oxy-nitride layer is used as an anti-reflection coating (ARC) layer and hence can be selectively formed or replaced by other anti-reflective materials.

Figure 14:
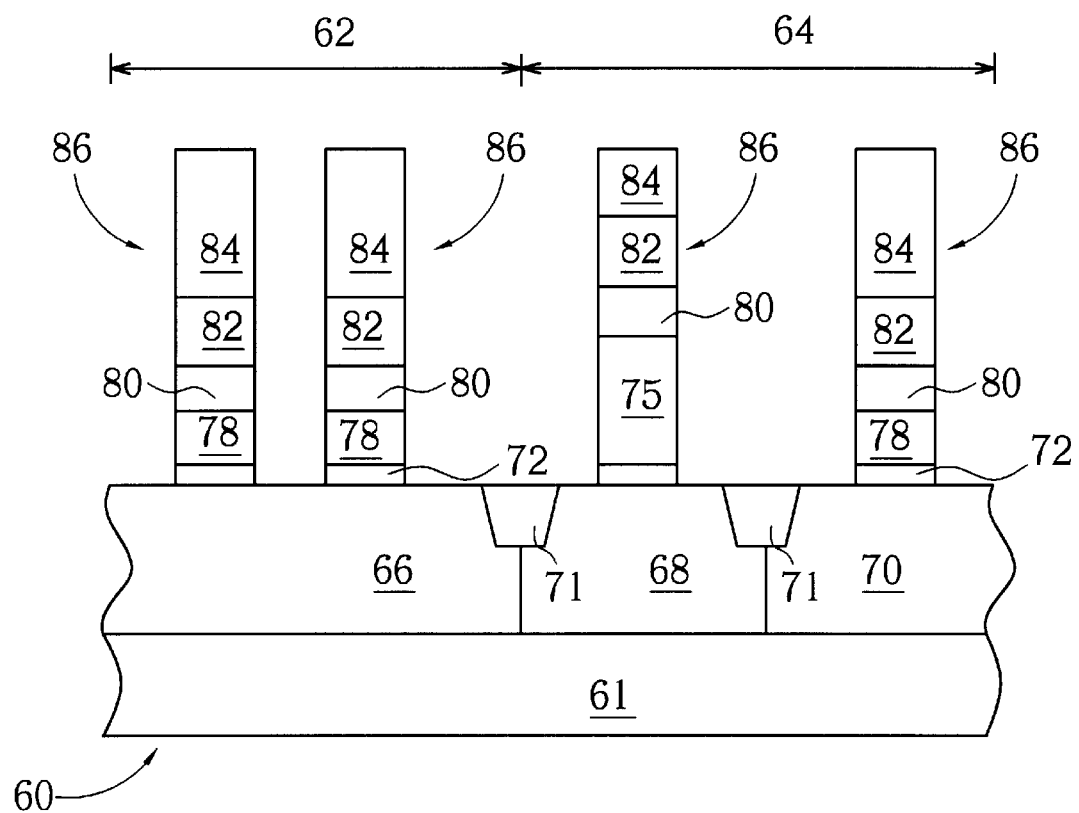

As shown in FIG. 14, a photolithographic process is performed so as to define a plurality of gate 86 patterns in the photoresist layer 84 positioned on the surface of the semiconductor wafer 60. Thereafter, the patterns in the photoresist layer 84 are used as a hard mask to etch the silicon nitride layer 82, the silicon-oxy-nitride layer, the silicide layer 80, the doped polysilicon layers 75, 78, and the dielectric layer 72 down to the surface underlying the dielectric layer 72. Thus, at least one MOS transistor gate 86 is simultaneously formed above the cell-well 66, the N-well 68 and the P-well 70.

Figure 15:
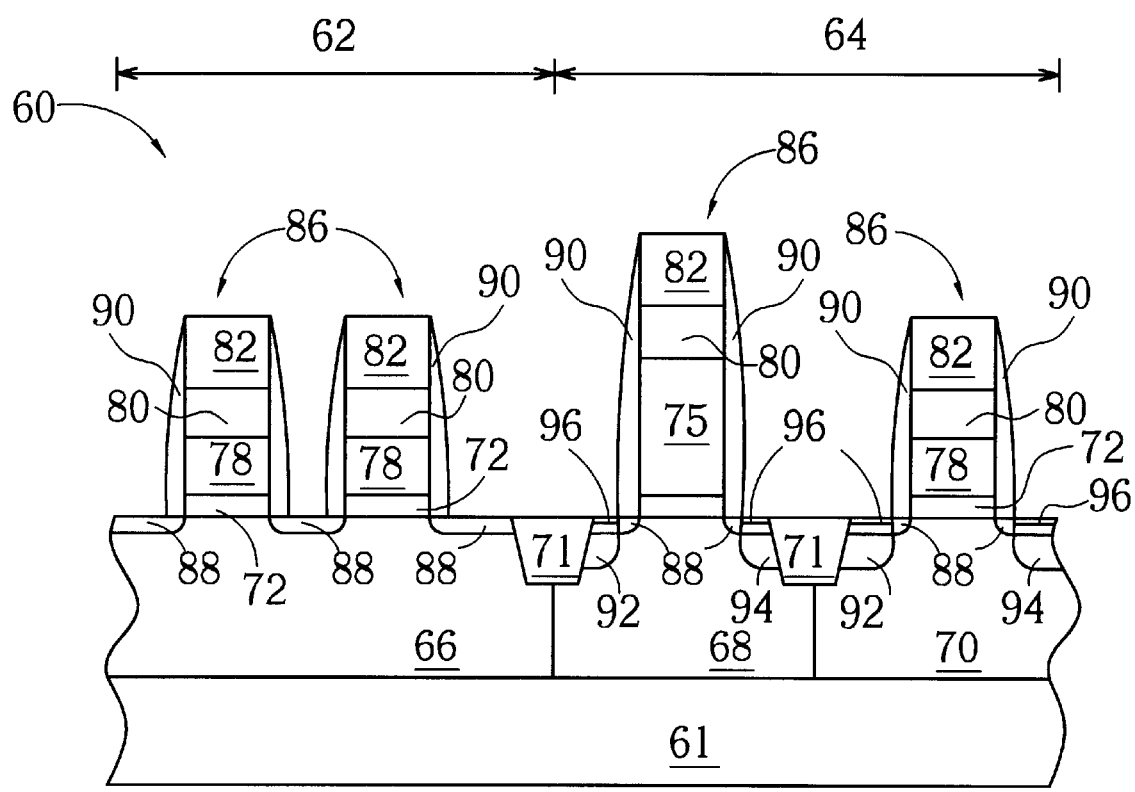

Then, as shown in FIG. 15, an ion implantation process is performed to form lightly doped drains (LDD) 88 for each MOS transistor. After removing the photoresist layer 84, a silicon nitride layer (not shown) is formed on the surface of the semiconductor wafer 60 to cover the surface of each gate 86, followed by an etching process to etch back portions of the silicon nitride layer as well as to form a spacer 90 on either side of each gate 86. Thereafter, a photolithographic process is used to define the NMOS position in the periphery circuit region 64, followed by the use of an ion implantation process to form a source 92 and a drain 94 of the NMOS transistor on the P-well 70. Next, another photolithographic process is used to define the PMOS position in the periphery circuit region 64 followed by the use of an ion implantation process to form a source 92 and a drain 94 of the PMOS transistor on the N-well 68.

After the formation of the source 92 and the drain 94 of each MOS transistor in the periphery circuit region 64, a metal layer (not shown) made of Co, is formed on the surface of the semiconductor wafer 60. The metal layer covers the surfaces of the sources 92 and the drains 94 in the periphery circuit region 64. Then, a first rapid thermal process (RTP) is performed at a temperature between 400° C. and 600° C. for a duration of 10 to 50 seconds, such that a salicide layer 96 is formed on the surfaces of each source 92 and drain 94 in the periphery circuit region 64. A wet etching process is then performed to remove the portions of the metal layer that do not react with the surface of the semiconductor wafer 60. Finally, a second rapid thermal process (RTP) is performed at a temperature between 600° C. and 800° C. for a duration of 10 to 50 seconds. As a result, the $Co_2Si$ and CoS of the salicide layer 96 react to form $CoSi_2$, which has a lower resistance. However, the Co metal layer can also be replaced by a Ti, Ni, or Mo metal layer.

The method of the present invention for manufacturing a MOS transistor of an embedded memory involves first etching the undoped polysilicon layer positioned on both the memory array area and the P-well in the periphery circuit region down to about half of the normal thickness. The thickness of the gates of both the pass transistor in the memory array area and the NMOS in the periphery circuit region is thus significantly reduced. As a result, the height difference of gates between the periphery circuit region and the memory array area is also reduced to prevent both boron penetration and short-circuiting due to the formation of void bridges.

In contrast to the prior art method for manufacturing a MOS transistor of an embedded memory, the height of the gates in the memory array area of the present invention is decreased by about 1000~1900 Å. Hence, the difference in height between the periphery circuit region and the memory array area is clearly reduced. Consequently, when filling the ILD layer, the formation of void bridges between two neighboring gates due to the high aspect ratio of the gates in the memory array area is avoided.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for fabricating a metal oxide semiconductor (MOS) transistor of an embedded memory, the method comprising:

providing a semiconductor wafer with both a memory array area and a periphery circuit region defined on the surface of the semiconductor wafer;

forming a dielectric layer and an undoped polysilicon layer, respectively, on the surface of the semiconductor wafer;

performing a first ion implantation process on the polysilicon layer in the memory array area so as to transform the polysilicon layer in the memory array area into a doped polysilicon layer;

etching the doped polysilicon layer to a predetermined thickness;

forming a silicide layer, a protection layer, and a photoresist layer, respectively, on the surface of the semiconductor wafer;

performing a photolithographic process so as to define a plurality of gate patterns in the photoresist layer;

using the gate patterns in the photoresist layer as a hard mask to etch the protection layer, the silicide layer, the undoped polysilicon layer, the doped polysilicon layer, and the dielectric layer down to the surface underlying the dielectric layer;

performing a second ion implantation process to form a lightly doped drain (LDD) of each MOS transistor;

removing the photoresist layer;

forming a silicon nitride layer on the surface of the semiconductor wafer to cover the surface of each gate;

performing an etching process to remove portions of the silicon nitride layer so as to form a spacer on either side of each gate; and performing a third ion implantation process to form a source and a drain in the periphery circuit region.

2. The method of claim 1 wherein the dielectric layer is composed of silicon dioxide ($SiO_2$) and serves as the gate oxide layer for each MOS transistor.

3. The method of claim 1 wherein the predetermined thickness is approximately half the total thickness of the undoped polysilicon layer.

4. The method of claim 1 wherein the protection layer is composed of a silicon nitride compound, and a silicon-oxy-nitride ($SiO_xN_y$) layer that serves as an anti-reflection coating (ARC) layer is positioned between the protection layer and the silicide layer.

5. The method of claim 1 wherein after the formation of the source and the drain of each MOS transistor in the periphery circuit region, the method also comprises:

forming a metal layer on the surface of the semiconductor wafer, the metal layer covering the surfaces of the sources and the drains in the periphery circuit region;

performing a first rapid thermal process (RTP);

performing a wet etching process to remove the portions of the metal layer that do not react with the surface of the semiconductor wafer; and performing a second rapid thermal process (RTP).

6. The method of claim 5 wherein the metal layer is composed of cobalt(Co), titanium(Ti), nickel(Ni), or molybdenum (Mo).

7. The method of claim 5 wherein the first rapid thermal process is performed at a temperature between 400° C. and 600° C. for a duration of 10 to 50 seconds, and the second rapid thermal process is performed at a temperature between 600° C. and 800° C. for a duration of 10 to 50 seconds.

8. A method for fabricating a metal oxide semiconductor (MOS) transistor of an embedded memory, the method comprising:

providing a semiconductor wafer with both a memory array area and a periphery circuit region defined on the surface of the semiconductor wafer, the memory array area comprising at least one cell-well, and the periphery circuit region comprising at least one N-well and at least one P-well;

forming a dielectric layer and an undoped polysilicon layer, respectively, on the surface of the semiconductor wafer;

performing a first ion implantation process on the undoped polysilicon layer above the N-well in the periphery circuit region so as to transform the undoped polysilicon layer above the N-well in the periphery circuit region into a $P^+$ doped polysilicon layer;

performing a second ion implantation process on the undoped polysilicon layer positioned in both the memory array area and on the P-well in the periphery circuit region so as to transform the undoped polysilicon layer positioned in both the memory array area and on the P-well in the periphery circuit region into a $N^+$ doped polysilicon layer;

etching the two $N^+$ doped polysilicon layers to a predetermined thickness;

forming a silicide layer, a protection layer, and a photoresist layer, respectively, on the surface of the semiconductor wafer;

performing a photolithographic process so as to define a plurality of gate patterns in the photoresist layer;

using the gate patterns in the photoresist layer as a hard mask to etch the protection layer, the silicide layer, the P+ doped polysilicon layer, the N+ doped polysilicon layer, and the dielectric layer down to the surface underlying the dielectric layer so as to simultaneously form at least a gate above the cell-well, the N-well and the P-well;

removing the photoresist layer;

performing a third ion implantation process to form lightly doped drains (LDD) for each MOS transistor;

forming a spacer on either side of each gate;

performing a fourth ion implantation process to form a source and a drain of an NMOS transistor on the P-well; and performing a fifth ion implantation process to form a source and a drain of a PMOS transistor on the N-well.

9. The method of claim 8 wherein the dielectric layer is composed of silicon dioxide ($SiO_2$) and serves as the gate oxide layer for each MOS transistor.

10. The method of claim 8 wherein the predetermined thickness is approximately half the total thickness of the undoped polysilicon layer.

11. The method of claim 8 wherein the protection layer is composed of silicon nitride, and a silicon-oxy nitride ($SiO_xN_y$) layer that serves as an anti-reflection coating (ARC) layer is positioned between the protection layer and the silicide layer.

12. The method of claim 8 wherein after the formation of the source and the drain of each MOS transistor in the periphery circuit region, the method also comprises:

forming a metal layer on the surface of the semiconductor wafer, the metal layer covering the surfaces of the sources and the drains in the periphery circuit region;

performing a first rapid thermal process (RTP);

performing a wet etching process to remove the portions of the metal layer that do not react with the surface of the semiconductor wafer; and performing a second rapid thermal process (RTP).

13. The method of claim 12 wherein the metal layer is composed of cobalt(Co), titanium(Ti), nickel(Ni) or molybdenum (Mo).

14. The method of claim 12 wherein the first rapid thermal process is performed at a temperature between 400° C. and 600° C. for a duration of 10 to 50 seconds, and the second rapid thermal process is performed at a temperature between 600° C. and 800° C. for a duration of 10 to 50 seconds.

* * * * *